United States Patent
Olsen et al.

(10) Patent No.: US 12,044,965 B2
(45) Date of Patent: Jul. 23, 2024

(54) METHOD FOR FORMING COMPONENTS WITHOUT ADDING TABS DURING ETCHING

(71) Applicant: Hutchinson Technology Incorporated, Hutchinson, MN (US)

(72) Inventors: Clark T. Olsen, Dassel, MN (US); Jeffery G. Ribar, Brownton, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 632 days.

(21) Appl. No.: 17/171,886

(22) Filed: Feb. 9, 2021

(65) Prior Publication Data

US 2021/0247691 A1 Aug. 12, 2021

Related U.S. Application Data

(60) Provisional application No. 62/975,554, filed on Feb. 12, 2020.

(51) Int. Cl.
*G03F 7/00* (2006.01)
*C09J 5/00* (2006.01)
(Continued)

(52) U.S. Cl.
CPC .............. *G03F 7/0012* (2013.01); *C09J 5/00* (2013.01); *C23C 2/024* (2022.08); *C23C 16/0227* (2013.01); *C23F 1/02* (2013.01); *H01L 21/02263* (2013.01); *H01L 21/0273* (2013.01); *H01L 21/6836* (2013.01); *H01L 21/76801* (2013.01); *C09J 2203/326* (2013.01);
(Continued)

(58) Field of Classification Search
CPC ..... G03F 7/0012; C09J 5/00; C09J 2203/326; C09J 2301/416; C09J 2433/00; C09J 2467/005; C09J 2467/006; C23C 2/024; C23C 16/0227; C23F 1/02; H01L 21/02263; H01L 21/0273; H01L 21/6836; H01L 21/76801; H01L 2221/1084; H01L 2221/68345; H01L 2221/68381
See application file for complete search history.

(56) References Cited

U.S. PATENT DOCUMENTS 4,288,282 A * 9/1981 Brown ................ G03F 7/0007
430/394
5,362,357 A * 11/1994 Takei .................... C23F 1/02
216/48
(Continued)

FOREIGN PATENT DOCUMENTS

EP 3039948 B1 * 10/2022 ............. B33Y 80/00

OTHER PUBLICATIONS

Nitto Denko Corporation, "ELP UB-3102D", Product Data Sheet.
(Continued)

*Primary Examiner* — Duy Vu N Deo
*Assistant Examiner* — Christopher Remavege
(74) *Attorney, Agent, or Firm* — DLA Piper LLP (US)

(57) ABSTRACT

A method for producing a component without tabs during etching. The method includes: applying a wafer tape to the plated side of the substrate; depositing a resist layer on a metal layer on a metal side of the substrate that is opposite of the plated side; exposing the resist layer to UV light; developing the resist layer; and etching the metal layer.

14 Claims, 3 Drawing Sheets

(51) Int. Cl.
    *C23C 2/02*         (2006.01)
    *C23C 16/02*      (2006.01)
    *C23F 1/02*        (2006.01)
    *H01L 21/02*      (2006.01)
    *H01L 21/027*     (2006.01)
    *H01L 21/683*     (2006.01)
    *H01L 21/768*     (2006.01)

(52) U.S. Cl.
    CPC ...... *C09J 2301/416* (2020.08); *C09J 2433/00* (2013.01); *C09J 2467/005* (2013.01); *C09J 2467/006* (2013.01); *H01L 2221/1084* (2013.01); *H01L 2221/68345* (2013.01)

(56) References Cited

U.S. PATENT DOCUMENTS

| | | | | |
|---|---|---|---|---|
| 5,800,723 | A * | 9/1998 | Juskey | H05K 3/0079 430/311 |
| 5,837,154 | A * | 11/1998 | Okabe | H05K 3/4092 216/14 |
| 6,508,945 | B1 * | 1/2003 | Hollinger | H01J 9/142 216/39 |
| 6,662,442 | B1 * | 12/2003 | Matsui | H05K 3/205 430/311 |
| 6,740,966 | B2 * | 5/2004 | Nakamura | H01L 23/49565 257/668 |
| 6,939,745 | B2 * | 9/2005 | Naito | H01L 24/50 438/125 |
| 7,585,419 | B2 * | 9/2009 | Cheng | H05K 1/113 216/13 |
| 7,829,384 | B2 * | 11/2010 | Omandam | H01L 21/6836 257/E23.179 |
| 7,939,935 | B2 * | 5/2011 | Chinda | H01L 23/49816 257/700 |
| 8,230,588 | B2 * | 7/2012 | Miyamoto | H01L 21/568 29/846 |
| 8,240,030 | B2 * | 8/2012 | Hamatani | H05K 3/4007 29/830 |
| 8,969,177 | B2 * | 3/2015 | Chowdhury | H01L 21/67207 438/464 |
| 9,196,597 | B2 * | 11/2015 | Su | H01L 23/296 |
| 9,252,057 | B2 * | 2/2016 | Chowdhury | H01L 21/67207 |
| 9,305,908 | B2 * | 4/2016 | Krabe | H05K 1/181 |
| 9,960,107 | B2 * | 5/2018 | Park | H01L 21/486 |
| 10,515,884 | B2 * | 12/2019 | Chen | H01L 21/486 |
| 11,178,730 | B2 * | 11/2021 | Myung | H01B 5/14 |
| 2002/0056926 | A1 * | 5/2002 | Jung | H01L 23/3107 257/750 |
| 2002/0108781 | A1 * | 8/2002 | Mune | H05K 3/205 29/846 |
| 2004/0130013 | A1 * | 7/2004 | Sunohara | H05K 1/185 257/E23.173 |
| 2004/0224436 | A1 * | 11/2004 | Naito | H01L 24/97 29/827 |
| 2005/0205524 | A1 * | 9/2005 | Lee | C23F 4/02 216/91 |
| 2005/0272608 | A1 * | 12/2005 | Yokozawa | G11B 5/484 |
| 2006/0089004 | A1 | 4/2006 | Yamamoto | |
| 2006/0284292 | A1 * | 12/2006 | Cheng | H01L 24/97 257/678 |
| 2007/0269590 | A1 * | 11/2007 | Miyamoto | H01L 21/568 427/125 |
| 2008/0214011 | A1 * | 9/2008 | Colburn | G03F 7/094 430/312 |
| 2010/0047626 | A1 * | 2/2010 | Hitomi | G11B 5/3133 216/17 |
| 2012/0070661 | A1 * | 3/2012 | Ikishima | H01L 21/6836 428/355 EN |
| 2012/0322233 | A1 * | 12/2012 | Lei | B23K 26/364 257/E21.602 |
| 2013/0256840 | A1 * | 10/2013 | Yun | H01L 23/544 257/620 |
| 2014/0106542 | A1 | 4/2014 | Chowdhury et al. | |
| 2014/0234664 | A1 * | 8/2014 | Yasumoto | H01L 29/786 156/247 |
| 2015/0243829 | A1 * | 8/2015 | Slafer | H01L 21/0273 438/73 |
| 2015/0294933 | A1 * | 10/2015 | We | H01L 23/5283 438/624 |
| 2018/0005916 | A1 * | 1/2018 | Chen | H01L 23/3675 |
| 2021/0247691 | A1 * | 8/2021 | Olsen | G03F 7/0012 |
| 2023/0183033 | A1 * | 6/2023 | Takashima | C09J 133/08 242/566 |

OTHER PUBLICATIONS

International Search Report and Written Opinion in International Application No. PCT/US2021/017470, mailed Apr. 28, 2021.
International Preliminary Report on Patentability in International Application No. PCT/US2021/017470, mailed Aug. 25, 2022.

* cited by examiner

METHOD FOR FORMING COMPONENTS WITHOUT ADDING TABS DURING ETCHING

CROSS-REFERENCE TO RELATED APPLICATIONS

This application claims the benefit of U.S. Provisional Application No. 62/975,554 filed on Feb. 12, 2020, which is hereby incorporated by reference in its entirety.

FIELD

Embodiments of the present disclosure relate to components. In particular, embodiments of the present disclosure relate generally to a process for making components without tabs during etching.

BACKGROUND

Current techniques for forming components require adding tabs to secure products to be etched to the frame. However, these conventional techniques increase the processing steps and packaging costs. For example, equipment is needed in order to de-tab the products from the carrier and place them into custom packages, which impacts floor space, capital equipment, tool build and repair, and quality issues like burrs and long tabs. Therefore, there is a need for a method for producing components without using tabs during etching, which would reduce the amount of processing steps and packaging costs.

SUMMARY

A method of forming a component without tabs during etching is described. The method includes applying an adhesive system to a first side of the substrate and depositing a resist layer on a metal layer on a metal side of the substrate opposite of the first side. The method further includes exposing the photoresist layer to light, developing the photoresist layer, etching the metal layer, and stripping the photoresist layer. The method further includes packaging the component using techniques including those known in the art.

Other features and advantages of embodiments of the present disclosure will be apparent from the accompanying drawings and from the detailed description that follows.

BRIEF DESCRIPTION OF THE DRAWINGS

Embodiments of the present disclosure are illustrated by way of example and not limitation in the figures of the accompanying drawings, in which like references indicate similar elements and in which.

DETAILED DESCRIPTION

Figure 1:
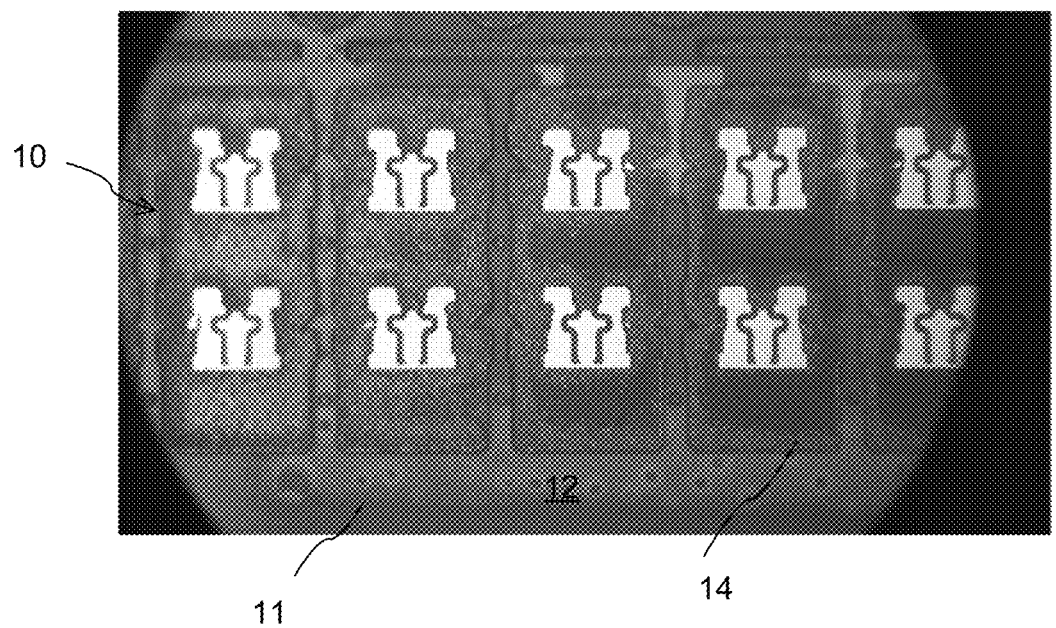
FIG. 1 illustrates a component including a substrate and an adhesive system attached thereto according to some embodiments.

A method of forming a component without tabs during etching is described. Referring to FIG. 1, a substrate 11 is prepared to form one or more components 10. A substrate 11 may include, but is not limited to, stainless steel, copper, a polymer film, ceramic, glass, semiconductor, nitinol, and other materials. For some embodiments, the substrate is in the form of a roll used in a reel to reel manufacturing process.

Figure 2:
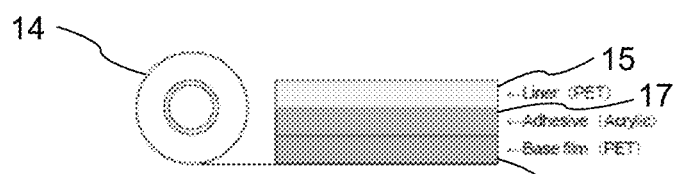
FIG. 2 illustrates an adhesive system according to some embodiments.

The substrate 11 includes a plated side 12, e.g., the side of the substrate that is electroplated with copper. The substrate 11 further includes a metal side 13, i.e., a non-plated side, that is opposite to the plated side 12. An adhesive system, for example, a wafer tape 14, is applied to a substrate 11. One or more wafer tapes 14 can be applied to one or both of a metal side 13 and a plated side 12 of a substrate 11. For some embodiments, wafer tape 14 is applied to the side of the substrate 11 that is opposite to a patterning operation and/or a release operation. However, the wafer tape 14 can be applied to any surface of a substrate 11. As shown in FIG. 2, the wafer tape 14 can include a releasable liner 15 that will be removed prior to mounting the wafer tape 14 to the plated side 12. For some embodiments, the releasable film 15 is made from polyethylene terephthalate (PET). The releasable liner 15 can also be made from other material known in the art.

The wafer tape 14 further includes a base layer 16 and an adhesive layer 17. The base layer 16 can be made from those material known in the art, including, but not limited to, polyethylene terephthalate film, polytetrafluoroethylene film, polyethylene film, polypropylene film, polymethylpentene film, polyvinyl acetate film, polyolefin film, polyvinyl chloride film, and polyimide films. For some embodiments, the base layer 16 is made from PET. The embodiments described herein using a wafer tape could use other adhesive systems instead.

The adhesive layer 17 is adhered to the plated side 12 of the substrate 11 as shown in FIG. 1. The adhesive layer 17 can be made from those material known in the art including, but not limited to, an acrylic resin, various synthetic rubber, natural rubber, and polyimide resins. For some embodiments, the adhesive layer 17 is made from an acrylic resin. In some embodiments, the wafer tape 14 used goes by the tradename "ELP UB-3102D" (made by Nitto Denko Corporation).

Figure 3:
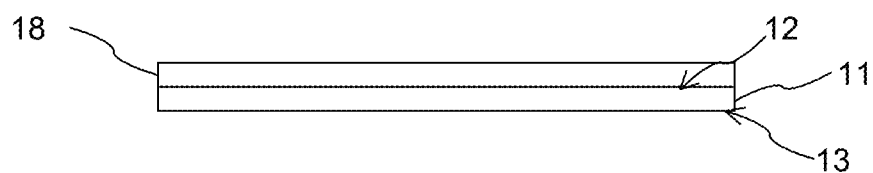
FIG. 3 illustrates a substrate with a dielectric layer disposed thereon according to some embodiments.

FIG. 3 illustrates a substrate with a dielectric layer 18 disposed thereon. A dielectric layer 18 is disposed on the substrate 11 according to some embodiments. For some embodiments, wafer tape 14 is applied to the side of the substrate 11 that is opposite to a patterning operation and/or a release operation. However, as described herein, the wafer tape 14 can be applied to any surface of a substrate 11. For some embodiments, a dielectric layer 18 is disposed between the substrate and another layer. The dielectric layer includes, but is not limited to, a photoresist, polyimide, KMPR, and SU-8 or other insulating materials. For some embodiments, the dielectric layer 18 is disposed on the substrate using a coating (liquid coating or dry film coating) technique. However, a dielectric layer 18 can be formed on the substrate using other techniques including those known in the art.

Figure 4:
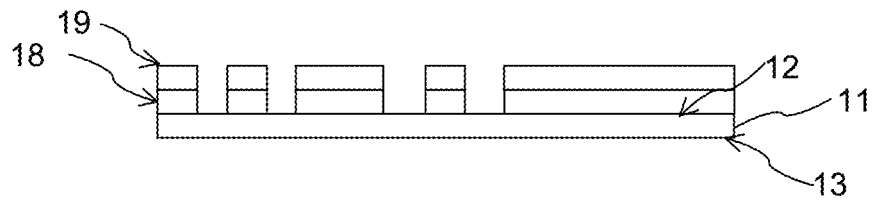
FIG. 4 illustrates a substrate with a dielectric layer that has been patterned according to some embodiments.

FIG. 4 illustrates a substrate with a dielectric layer 18 that has been patterned according to an embodiment. For some embodiments, a photoresist layer 19 is formed on the dielectric layer 18. The photoresist layer 19, according to some embodiments, is exposed using photolithography techniques including those known in the art and developed using wet etch techniques including those known in the art. This patterned photoresist layer 19 then provides the pattern for the dielectric during a dielectric removal process, either wet or dry techniques can be used. For other embodiments, the dielectric layer 18 is a photosensitive polyimide layer and is patterned directly using photolithography techniques including those known in the art and developed using wet etch techniques including those known in the art. Still another patterning method is laser ablation of the unwanted dielectric.

Figure 5:
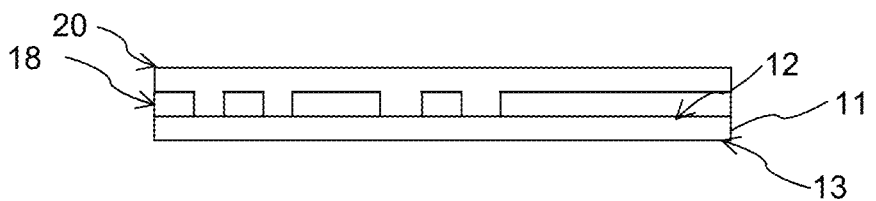
FIG. 5 illustrates a metal layer disposed on the dielectric layer according to some embodiments.

FIG. 5 illustrates a metal layer 20 disposed on the dielectric layer 18 according to some embodiments. A metal layer 20 is formed on the dielectric layer 18 using techniques including, but not limited to, physical vapor deposition, chemical vapor deposition, and electroless chemical deposition. For some embodiments, a seed layer is formed on the dielectric layer as a first step to forming a metal layer 20. For example, a seed layer such as nickel-chromium is sputtered on the dielectric layer 19. Copper, for example, is deposited on the seed layer using electroless chemical deposition or plating. The metal layer 20 and the seed layer can also be made from other material known in the art.

Figure 6:
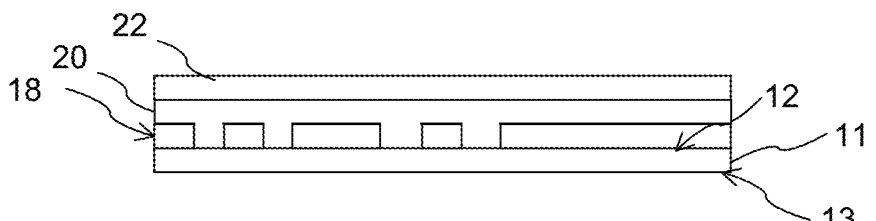
FIG. 6 illustrates a resist layer deposited on the metal layer according to some embodiments.

FIG. 6 illustrates a resist layer 22 deposited on the metal layer 20 according to some embodiments. For some embodiments, the method includes depositing a resist layer 22 on the metal layer 20. The metal layer 20 can be a constantan layer or made from any metal material that is known in the art for such metal layers. The resist layer 22 is applied using techniques including, but not limited to, liquid slot die, roller coat, spray, curtain coat, dry film lamination, and screen-printing techniques. The resist layer 22 can be made the material discussed above and/or material that is known in the art.

Figure 7:
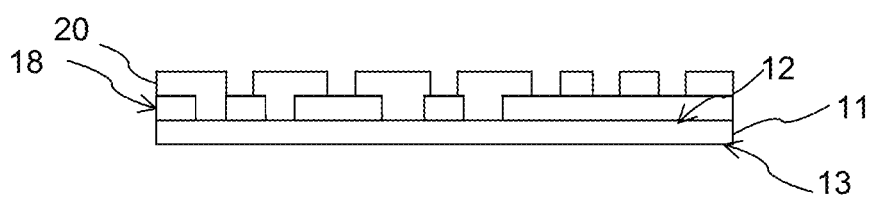
FIG. 7 illustrates the metal layer having an etched pattern according to some embodiments.

FIG. 7 illustrates the metal layer 20 having an etched pattern. For some embodiments, the etched pattern is formed when the resist layer 22 is exposed to UV light, developed, etched (that is, the metal layer 20 is etched in regions not protected by the resist pattern), and stripped using photolithography and etching techniques including those known in the art. For some embodiments, the after the resist layer 22 is developed to expose at least a portion of the metal layer 20. Then, an electroplating process is used to electroplate the exposed portions of the metal layer 20. For example, copper, nickel, and/or gold can be electroplated on the exposed portions of the metal layer 20.

Figure 8:
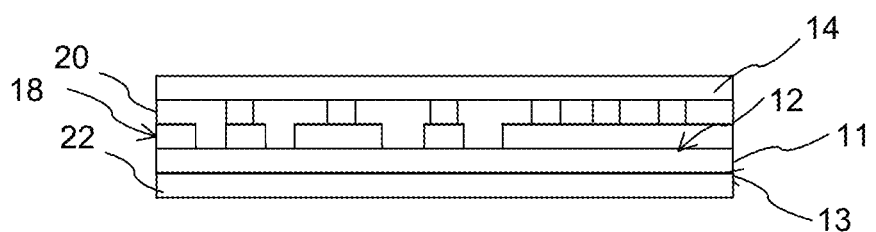
FIG. 8 illustrates a flow chart of the method for producing a component without tabs during etching according to some embodiments.

As shown in FIG. 8, according to some embodiments, the method includes applying a wafer tape 14 to the plated side 12 of the substrate 11 and depositing a resist layer 22 a metal side 13 of the substrate 11. For some embodiment, the wafer tape 14 is applied to the substrate 11 using a continuous process as part of a reel to reel manufacturing process. The resist layer 22 is applied using techniques including, but not limited to, liquid slot die, roller coat, spray, curtain coat, dry film lamination, and screen-printing techniques. The resist layer 22 is then exposed to UV light, developed, etched (that is, the metal layer 20 is etched in regions not protected by the resist pattern), and stripped using photolithography and etching techniques including those known in the art.

In some embodiments, the method further includes packaging the component. Because the adhesive layer of the wafer tape can be sticky, any exposed areas of the adhesive layer disposed between the base layer and the substrate can be exposed to UV light to partially or fully cure the adhesive layer to facilitate packaging.

When an adhesive system, such as wafer tape, is used, it starts out sticky so the part/sheet/foil/etc. will stick to it during processing. Once etching and stripping are complete, according to some embodiments, the wafer tape will have exposed areas which remain sticky. UV or other energy sources can be used to cure the adhesive and make it less sticky. If exposed from the part side, the areas between the parts get cured and lose tack, but the adhesive under the parts does not cure and will remain sticky and the parts remain strongly fastened to the wafer tape for some embodiments. To release the parts from the wafer tape, a UV light or energy source is applied from base layer side and cures the adhesive layer (UV goes through the base layer) and reduces the tack so the parts can come off easier. When it's time to remove the parts from the wafer tape, one would expose the film side to UV to release the parts, then pick parts off the tape. This can be done manually or with automated equipment (e.g., a die bonder such as Datacon). An alternate method is to use a transfer tape method in which a second tape is applied to the first tape, now with the parts sandwiched in between. The second tape needs to have more tack than the first, so that the first tape can be peeled off and the parts remain on the second tape. The part, according to some embodiments, is released from the wafer tape by cutting the wafer tap, for example, by using a laser or other ablation technique such as those known in the art.

Figure 9:
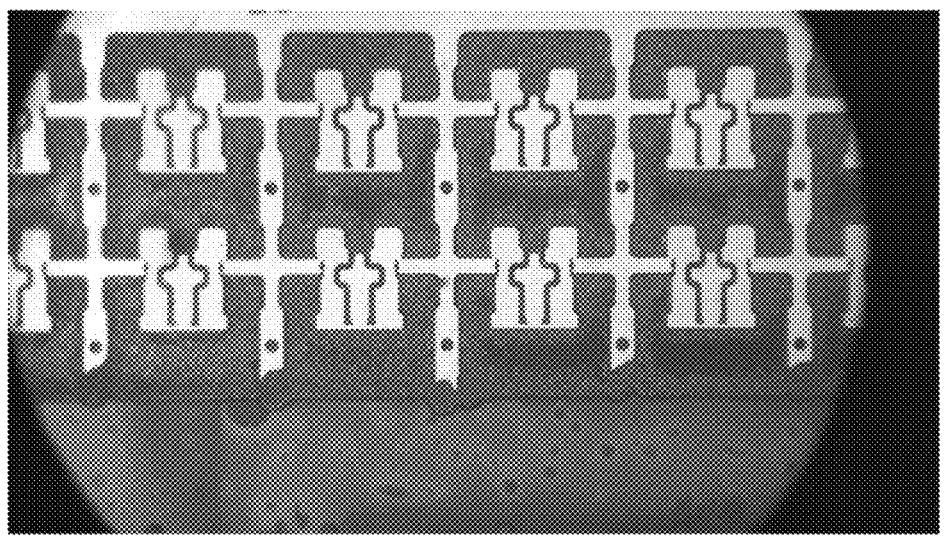
FIG. 9 illustrates components formed by conventional techniques that require tabs.
Figure 10:
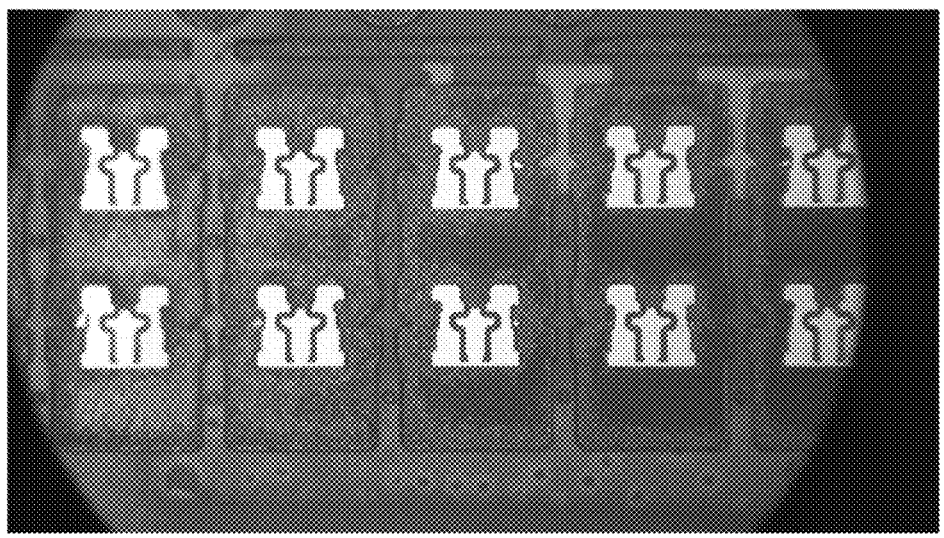
FIG. 10 illustrates components formed by the method of the present disclosure that does not require tabs according to some embodiments.

FIG. 9 illustrates components formed by conventional techniques that require tabs. FIG. 10 illustrates components formed by the method of the present disclosure that does not require tabs. The method of the present disclosure advantageously reduces the amount of processing steps and packaging costs relative to conventional techniques. Further, another advantage over current process and systems is that parts can be arranged closer to each other because no space is required for tabs. The number of parts per square area can increase and cost go down just from putting parts where there used to be tabs. And, the use of a wafer tape results in a reduction in material used to produce a part/component and the amount of scrap left over.

Although described in connection with these embodiments, those of skill in the art will recognize that changes can be made in form and detail without departing from the spirit and scope of the disclosure.

What is claimed is:

1. A method for forming a component without tabs, comprising:
   disposing a dielectric layer on a first side of a substrate, wherein the substrate includes both the first side and a second side;
   disposing a first resist layer on the dielectric layer;
   patterning the dielectric layer in a first pattern according to the first resist layer;
   disposing a metal layer over the patterned dielectric layer and first side of the sub strategy;
   disposing a second resist layer on the metal layer;

developing the metal layer according to a second pattern based on the resist layer to expose at least a portion of the metal layer; and applying a wafer tape to the first side of the substrate.

2. The method according to claim 1, comprising:

etching the metal layer.

3. The method according to claim 2, comprising:

stripping the second resist layer after etching.

4. The method according to claim 1, further comprising:

packaging the component.

5. The method according to claim 1, wherein the wafer tape includes a releasable film that is removed prior to mounting the wafer tape to the substrate.

6. The method according to claim 5, wherein the releasable film is made from polyethylene terephthalate.

7. The method according to claim 1, wherein the wafer tape includes a base layer and an adhesive layer.

8. The method according to claim 7, wherein the adhesive layer is placed in contact with the substrate.

9. The method according to claim 7, wherein the adhesive layer is made from a material selected from the group consisting of an acrylic resin, synthetic rubber, natural rubber, and a polyimide resin.

10. The method according to claim 7, wherein the adhesive layer is made from an acrylic resin.

11. The method according to claim 7, wherein the base layer is made from polyethylene terephthalate.

12. The method according to claim 8 comprising:

exposing any exposed areas of the adhesive layer placed in contact with the substrate to UV light.

13. The method according to claim 1, wherein disposing the metal layer on the patterned dielectric layer includes forming a seed layer on the patterned dielectric layer.

14. The method according to claim 1, wherein applying the wafer tape to the substrate includes using a continuous process as part of a reel to reel manufacturing process.

* * * * *